(12) United States Patent
Sellmair et al.

(10) Patent No.: US 6,314,031 B1
(45) Date of Patent: Nov. 6, 2001

(54) MEMORY DEVICE

(75) Inventors: Gerald Sellmair, Landshut; Andrea Bartl, München, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/711,864

(22) Filed: Nov. 13, 2000

(30) Foreign Application Priority Data

Nov. 11, 1999 (DE) .............................. 199 54 345

(51) Int. Cl.[7] .................................................. G11C 29/00
(52) U.S. Cl. ...................................... 365/200; 365/230.06
(58) Field of Search ..................................... 365/200, 201, 365/189.07, 185.09, 230.06

(56) References Cited

U.S. PATENT DOCUMENTS

| 5,528,540 | * | 6/1996 | Shibata et al. | 365/200 |
| 5,586,075 | * | 12/1996 | Miwa | 365/185.29 |
| 6,157,585 | * | 12/2000 | Kim | 365/200 |
| 6,188,618 | * | 2/2001 | Takase | 365/200 |

* cited by examiner

Primary Examiner—Tan T. Nguyen
(74) Attorney, Agent, or Firm—Herbert L. Lerner; Laurence A. Greenberg; Werner H. Stemer

(57) ABSTRACT

The memory device has a selection device which, when required, ensures that backup memory cells or backup memory cell areas are used instead of memory cells or memory cell areas which cannot be written to or read from properly. Information about the location of the memory cells which are possibly not to be used is actually supplied to the selection device at an instant at which it is not yet definite whether memory cells need to be replaced.

8 Claims, 2 Drawing Sheets

MEMORY DEVICE

BACKGROUND OF THE INVENTION

Field of the Invention

The invention lies in the field of memory device technology. More specifically, the invention relates to a memory device having a multiplicity of memory cells for storing data, having at least one comparison unit, which can check whether an address applied to the memory device has an associated memory cell which cannot be written to or read from properly or is in a memory cell area containing memory cells which cannot be written to or read from properly, and having a selection device which, when required, ensures that backup memory cells or backup memory cell areas are used instead of memory cells or memory cell areas which cannot be written to or read from properly.

A memory device of this type is shown schematically in FIG. 2. It will be understood by those of skill in the pertinent art that the figure illustrates only those component parts of the memory device which are of particular interest in the present case.

The memory device is denoted by the reference symbol S in FIG. 2.

In the example under consideration, the memory device S is designed to store 16 Mbits of data, and therefore has at least 16 M memory cells. In the example under consideration, the memory cells present are distributed over 16 memory blocks SB1 to SB16 of identical size, that is to say in memory blocks each designed to store 1 Mbit of data. The memory blocks SB1 to SB16 are in turn distributed over four memory banks SBankA, SBankB, SBankC and SbankD. The memory banks have identical sizes.

In the example under consideration, the memory cells in each memory block are arranged in a memory cell matrix comprising 512 rows and 2048 columns, that is to say they can be addressed via 512 word lines and 2048 bit lines. The measures specifically to be taken in order to write to or read from selected memory cells are known to those of skill in the pertinent art and require no more detailed explanation.

The memory cells to be written to or read from in each case are determined by an address which is applied to the memory device, or more precisely which is applied to connections A1 to An thereof; the data which are to be written to the memory cells concerned or which are to be read from the memory cells concerned are applied to connections D1 to Dm of the memory device or are provided for collection on these connections.

The memory device under consideration has more than the 16 M memory cells required to store 16 Mbits of data. This is done for redundancy purposes, so that memory cells or memory cell areas which cannot be written to or read from properly can be replaced by other memory cells or memory cell areas.

The memory cells or memory cell areas which cannot be written to or read from properly, or more precisely the addresses associated with these memory cells or memory cell areas, are ascertained in a test on the memory device and are recorded in the memory device, for example using so-called fuses F.

In normal operation of the memory device, comparison units VE compare the addresses applied to the memory device via the latter's connections A1 to An with the addresses recorded in the memory device for the memory cells or memory cell areas which cannot be written to or read from properly. If such a comparison produces a match, then this is signaled to a selection device AE, and the latter ensures that data which is to be written to the memory device is not, for example, written to the memory cells denoted by the address applied to the memory device, but rather to (backup) memory cells associated with the unusable memory cells, and that data which is to be read from the memory device is not, for example, read from the memory cells denoted by the address applied to the memory device, but rather from the (backup) memory cells associated with the unusable memory cells.

In the manner described, memory devices in which not all the memory cells can be written to and read from properly can be used as fully operational memory devices; the user of the memory device is unaware that particular memory cells or memory cell areas are being replaced by backup memory cells or backup memory cell areas.

However, the check to determine whether the memory cells or memory cell areas which are currently to be written to or read from need to be replaced with backup memory cells or backup memory cell areas and the replacement of the unusable memory cells or memory cell areas are associated with a not inconsiderable level of complexity and/or limit or reduce the speed at which data can be written to the memory device or can be read therefrom.

SUMMARY OF THE INVENTION

The object of the invention is to provide a memory device which overcomes the above-noted deficiencies and disadvantages of the prior art devices and methods of this kind, and in which access operations on memory cells or memory cell areas which cannot be written to or read from properly can be detected and these memory cells or memory cell areas can be replaced as quickly as possible and with a minimum level of complexity.

With the above and other objects in view there is provided, in accordance with the invention, a memory device, comprising:

a multiplicity of memory cells for storing data;

at least one comparison unit having an address input and being configured to check whether an address received at the address input has a memory cell associated therewith which cannot be written to or read from properly or is in a memory cell area containing memory cells which cannot be written to or read from properly; and a selection device connected to the comparison unit, the selection device being configured to ensure that backup memory cells or backup memory cell areas are used instead of memory cells or memory cell areas which cannot be written to or read from properly;

wherein information about a location of the memory cells or memory cell areas which are not to be used is supplied to the selection device at an instant at which a determination has not yet been made that the address received at the address input has a memory cell associated therewith which cannot be written to or read from properly or is in a memory cell area containing memory cells which cannot be written to or read from properly.

With the above and other objects in view there is also provided, in accordance with the invention, a related memory device in which information about the location of the memory cells or memory cell areas which are not to be used is actually supplied to the selection device before an instant at which the selection device is prompted to ensure that backup memory cells or backup memory cell areas are used instead of memory cells or memory cell areas which cannot be written to or read from properly.

In accordance with an added feature of the invention, the selection device only ensures that backup memory cells or backup memory cell areas are used instead of memory cells or memory cell areas which cannot be written to or read from properly if it has previously been prompted to do so, and the prompt signal is issued only when it has been determined that the address applied to the memory device has an associated memory cell which cannot be written to or read from properly or is in a memory cell area containing memory cells which can not be written to or read from properly.

In accordance with an additional feature of the invention, the at least one comparison unit is configured to carry out a plurality of comparison operations, and wherein a circumstance of whether an address applied to the memory device has an associated memory cell which cannot be written to or read from properly or is in a memory cell area containing memory cells which cannot be written to or read from properly is determined only when all comparison results are present.

In accordance with a concomitant feature of the invention, the selection device receives information about the location of the memory cells or memory cell areas which are not to be used as soon as one or more comparison results mean that it is no longer possible to rule out that the address applied to the memory device has an associated memory cell which cannot be written to or read from properly or is in a memory cell area containing memory cells which cannot be written to or read from properly.

In other words, the invention provides:

that information about the location of the memory cells or memory cell areas which are not to be used is actually supplied to the selection device at an instant at which it is not yet definite that the address applied to the memory device has an associated memory cell which cannot be written to or read from properly or is in a memory cell area containing memory cells which cannot be written to or read from properly, and/or that information about the location of the memory cells or memory cell areas which are not to be used is actually supplied to the selection device before the instant at which it is prompted to ensure that backup memory cells or backup memory cell areas are used instead of memory cells or memory cell areas which cannot be written to or read from properly.

As a result of this, once it has been established that the address applied to the memory device has an associated memory cell which cannot be written to or read from properly or is in a memory cell area containing memory cells which cannot be written to or read from properly, the selection device can immediately begin to replace the unusable memory cells or memory cell areas with backup memory cells or backup memory cell areas; the information about the location of the memory cells or memory cell areas which are not to be used, which is required by the selection device for this purpose, is already available to the selection device at this instant.

In memory devices of this type, access operations on memory cells or memory cell areas which cannot be written to or read from properly can be detected and these memory cells or memory cell areas can be replaced with backup memory cells or backup memory cell areas as quickly as possible and with a minimum level of complexity.

If unusable memory cells or memory cell areas are always replaced with memory cells or memory cell areas which are in the same memory cell row as the unusable memory cells or memory cell areas, all the memory cells in a memory cell row are always read from (when reading data) and the selection device is allowed to define (when reading and writing data) which of the memory device's connections intended for data input and/or output is associated with which memory cell, then the checks and actions required in order to be able to replace unusable memory cells or memory cell areas can actually be carried out without any, or at any rate without any significant, additional time involvement.

Other features which are considered as characteristic for the invention are set forth in the appended claims.

Although the invention is illustrated and described herein as embodied in a memory device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
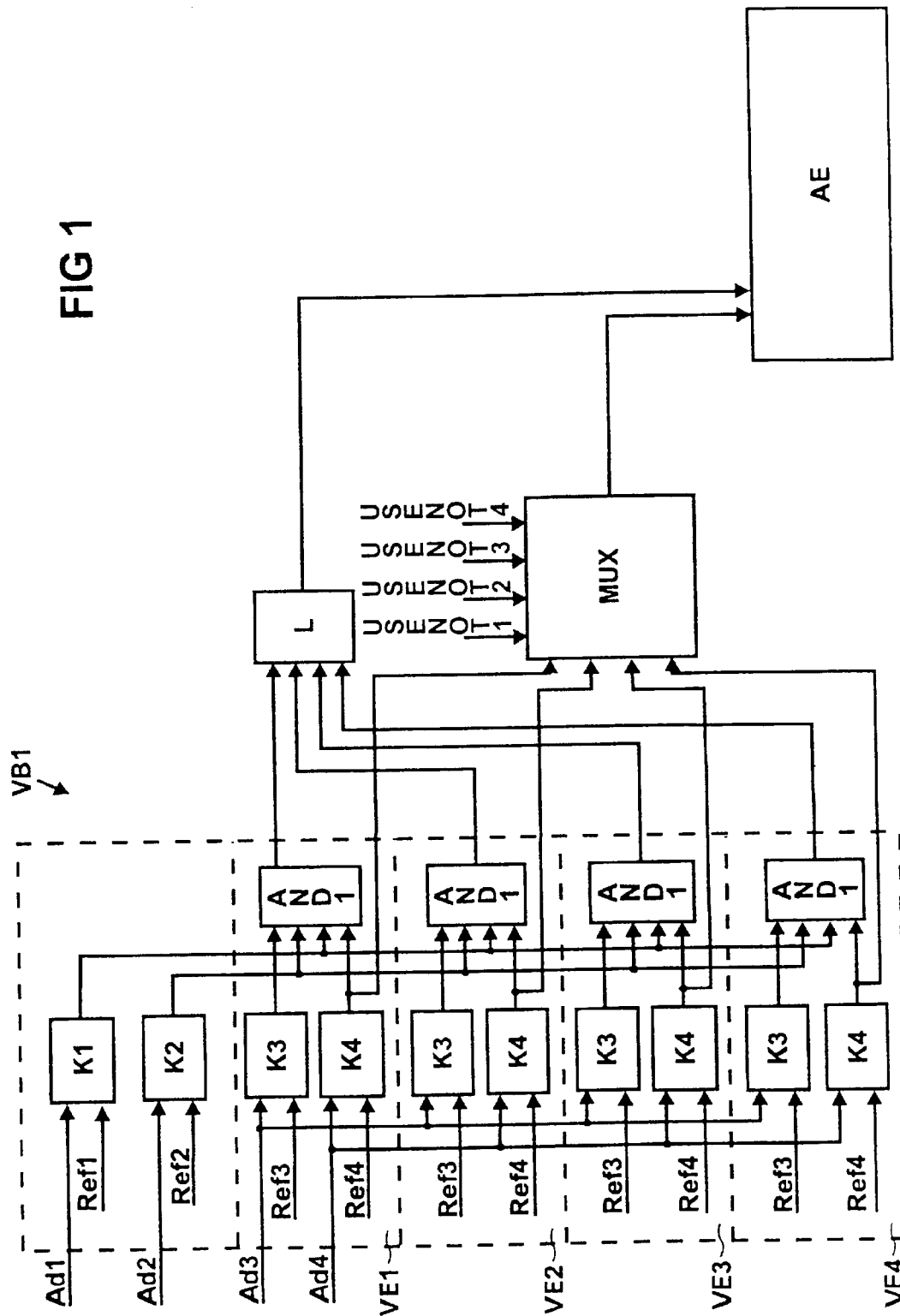
FIG. 1 is a block schematic of components of the memory device described in more detail below which are used to replace unusable memory cells or memory cell areas with backup memory cells or backup memory cell areas, in accordance with the invention.

Referring now to the figures of the drawing in detail and first, particularly, to FIG. 1 thereof, the memory device under consideration in the present case is a RAM module, more precisely a DRAM module. However, it should be pointed out before continuing that there is no restriction to this. The memory device may also be any other desired memory device for storing data.

Figure 2:
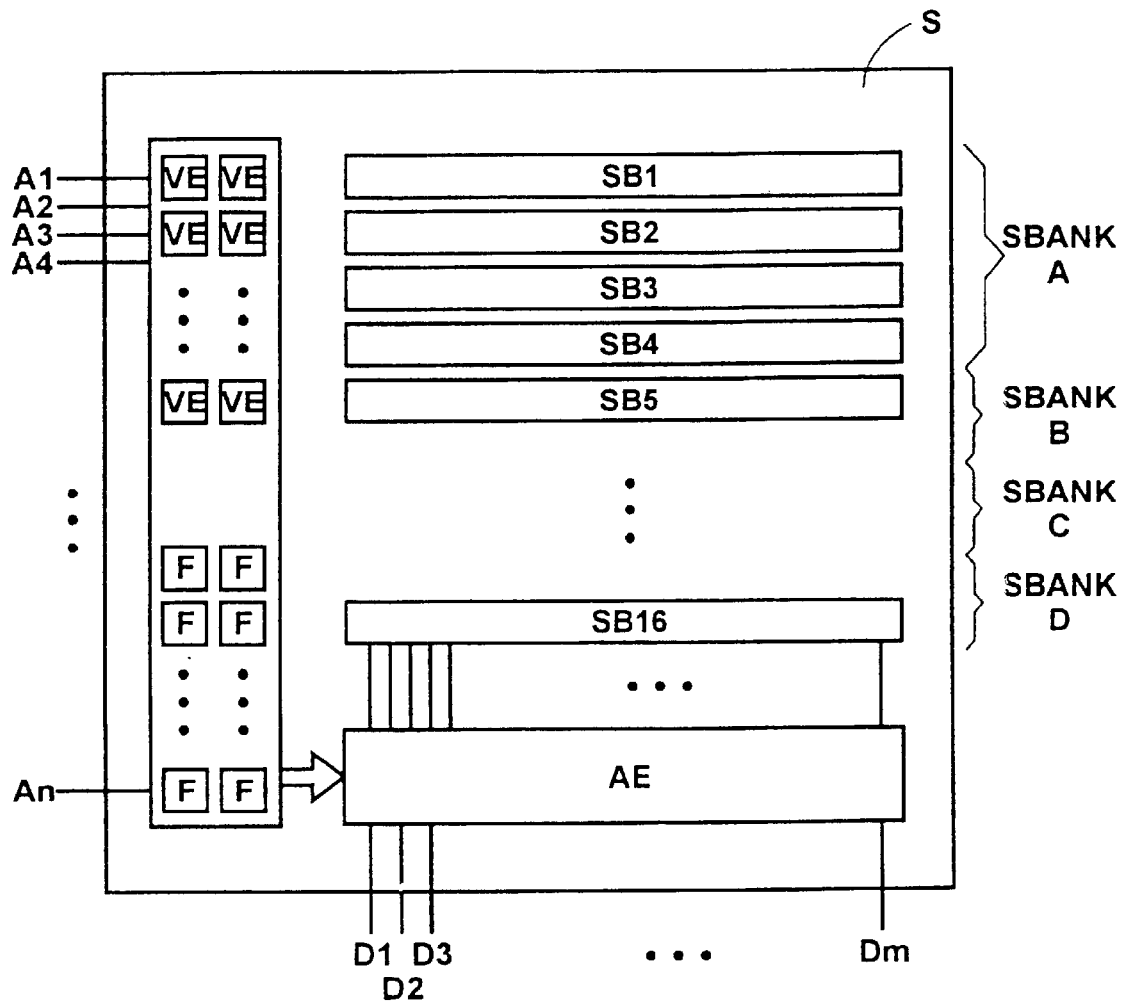
FIG. 2 is a block diagram of the basic design of a memory device of the type under consideration in the present case.

The memory device described in more detail below has the same basic design as the memory device described above with reference to FIG. 2.

The memory device according to the invention also has more memory cells than are required to store a volume of data corresponding to the usable storage capacity. The additional memory cells are able to be used as backup memory cells or backup memory cell areas for memory cells or memory cell areas which cannot be written to or read from properly.

The memory cells or memory cell areas which cannot be written to or read from properly are ascertained by testing the memory cells. The addresses of these memory cells or memory cell areas are recorded in the memory device using fuses, in the example under-consideration using fuses F which can be blown by a laser.

In normal operation of the memory device, the comparison units VE are used to compare the addresses applied to the said memory device with the addresses recorded in the memory device for the memory cells or memory cell areas which cannot be written to or read from properly; the comparison units VE use the addresses of the memory cells or memory cell areas which cannot be written to or read from properly as reference addresses with which they compare the addresses applied to the memory device.

If a comparison unit establishes a match between the addresses which are to be compared, it signals this to the selection device AE, which then ensures that data which is to be written to the memory device is not, for example, written to the memory cells associated with the address applied to the memory device, but rather to (backup) memory cells associated with the unusable memory cells, and that data which is to be read from the memory device is not, for example, read from the memory cells which are associated with the address applied to the memory device, but rather from (backup) memory cells associated with the unusable memory cells.

In the example under consideration, 16 comparison units are provided for each memory block. In this context, these comparison units are split into comparison unit banks each comprising four comparison units. As will become clear from the following, the comparison unit banks are each associated with a particular memory block in the present case.

It will be understood that it is also possible for more or fewer comparison units to be provided and that the comparison units can also be split into comparison unit banks comprising more or fewer comparison units, or may not be split into comparison unit banks at all.

Each comparison unit has a dedicated reference address associated with it.

The comparison units which are present operate in parallel, so that all the comparison units compare each of the addresses applied to the memory device with the reference addresses associated with said comparison units at the same time, that is to say with all the reference addresses at the same time.

A comparison unit bank comprising four comparison units and the connection of the comparison unit bank to the selection device are shown in FIG. 1.

In this case, the comparison units are denoted by the reference symbols VE1, VE2, VE3 and VE4, the comparison unit bank containing these comparison units is denoted by the reference symbol VB1 and the selection device controlled by said bank is denoted by the reference symbol AE.

Besides the comparison units VE1 to VE4, the comparison unit bank VB1 contains two comparators K1 and K2, where the comparator K1 checks whether the memory bank addressed by the address supplied to the memory device is the memory bank containing the memory block with which the comparison unit bank concerned is associated (by means of the reference addresses associated with the comparison units contained therein), and the comparator K2 checks whether the memory block addressed by the address supplied to the memory device is that memory block (within the selected memory bank) with which the comparison unit bank concerned is associated (by means of the reference addresses associated with the comparison units contained therein).

In the example under consideration, the comparison units VE1 to VE4 are of identical design. They each contain comparators K3 and K4 and an AND gate AND1, where the comparators K3 each check whether the memory cell columns associated with the address supplied to the memory device are the memory cell columns or are at least to some extent among the memory cell columns which are associated with the reference address associated with the comparison unit concerned, the comparators K4 each check whether the memory cell row associated with the address supplied to the memory device is the memory cell row or is among the memory cell rows which is/are associated with the reference address associated with the comparison unit concerned, and the AND gates AND1 subject the output signals from the local comparators K3 and K4 provided in the comparison units concerned and also the output signals from the global comparators K1 and K2 to an AND operation.

The output signals from the AND gates AND1 indicate whether the address applied to the memory device matches the reference address associated with the comparison unit concerned. An established match signals that the address applied to the memory device has an associated memory cell which cannot be written to or read from properly or is in a memory cell area containing memory cells which cannot be written to or read from properly.:

The output signals from all the AND gates AND1 in a respective comparison unit bank are supplied to a logic unit L, and the output signal therefrom controls the aforementioned selection device AE, which, when required, ensures that backup memory cells associated with the unusable memory cells are accessed; the selection device AE is prompted to replace unusable memory cells or memory cell areas with backup memory cells or backup memory cell areas when one of the AND1 output signals indicates that the comparison unit concerned has established a match between the address supplied to the memory device and the reference address associated with the comparison unit, and the selection device AE is not prompted to replace memory cells or memory cell areas if no match has been established between the address applied to the memory device and the reference addresses.

The input signals received by the comparators K1 to K4 are Ad1 and Ref1 (comparator K1), Ad2 and Ref2 (comparator K2), Ad3 and Ref3 (comparator K3), and Ad4 and Ref4 (comparator K4), where Ad1 to Ad4 are parts of the address applied to the memory device or are extracted therefrom, Ref1 to Ref3 are parts of the reference addresses associated with the comparison units or are extracted therefrom and, in the example under consideration, are set in the memory device using fuses F, and Ref 4 is a part of the reference addresses associated with the comparison units or is extracted therefrom and, in the example under consideration, is permanently (unchangeably) set in the memory device when the memory device is manufactured.

The input signals Ad1 and Ref1 specify the memory bank to which each of the addresses relate. In the exemplary embodiment, each comprises 2 bits (because the exemplary memory device comprises or may comprise four memory banks). The input signals Ad2 and Ref2 specify that memory block within the selected memory bank to which each of the addresses relates and, in the exemplary embodiment, likewise each comprises 2 bits (because the memory banks each comprises or may comprise 4 memory blocks).

The input signals Ad3 and Ref3 specify the memory cell columns associated with the addresses. In the exemplary embodiment, each comprises two bits, more precisely the two most significant bits of the column addresses.

The input signals Ad4 and Ref4 specify the memory cell row(s) associated with the addresses. In the exemplary embodiment, each comprises two bits, more precisely the two most significant bits of the row addresses.

In the example under consideration, the input signals Ref4 are set such that, irrespective of the address supplied to the memory device, just one comparator K4 in each comparison unit bank signals a match in each case, that is to say, for example, to 00 or VE1, to 01 for VE2, to 10 for VE3, and to 11 for VE4.

As a result of the fact that only the two most significant bits in each case are taken into account in the comparisons to be carried out between the column addresses and the row addresses, the "only" check carried out during the comparisons is to determine whether the address applied to the memory device denotes a memory cell which is within a memory cell area containing memory cells which cannot be written to or read from properly. Hence, not only individual memory cells are replaced by backup memory cells, for example, but rather memory cell areas of larger or smaller size are replaced by backup memory cell areas.

As has already been mentioned a number of times above, the replacement of unusable memory cells or memory cell areas with backup memory cells or backup memory cell areas is carried out by the selection device AE; the selection device AE is prompted to do this, when required, by the output signal from the logic unit L.

Besides the signal initiating the memory cell or memory cell area replacement, information about the location of the memory cells or memory cell areas which are to be replaced is also supplied to the selection device AE.

The selection device AE receives this information from a multiplexer MUX controlled by the output signals from the comparators K4 in the comparison units VE1 to VE4.

The multiplexer MUX
switches through data USENOT1 to the output if the output signal from the comparator K4 in the comparison unit VE1 signals a match,
switches through data USENOT2 to the output if the output is signal from the comparator K4 in the comparison unit VE2 signals a match,
switches through data USENOT3 to the output if the output signal from the comparator K4 in the comparison unit VE3 signals a match, and
switches through data USENOT4 to the output if the output signal from the comparator K4 in the comparison unit VE4 signals a match.

Each data item USENOT1 to USENOT4 comprises four bits and is set in the memory device using fuses F. These indicate which memory cells or memory cell areas within the memory cell row to which data is to be written or from which data is to be read need to be replaced with backup memory cells or backup memory cell areas.

By virtue of the fact that the selection device AE is supplied with information about the location of the memory cells or memory cell areas which are not to be used, it knows which memory cells or memory cell areas need to be replaced with backup memory cells or backup memory cell areas for the current write or read operation.

The backup memory cells or backup memory cell areas used to replace the memory cells or memory cell areas specified by USENOT1, USENOT2, USENOT3 and USENOT4 can be determined by the selection device AE itself in the example under consideration. This is because, in the example under consideration, the selection device AE contains a stipulation regarding the association between the locations of the memory cells or memory cell areas to be replaced and the backup memory cells or backup memory cell areas to be used.

The selection device AE could, of course, also receive the information about the location of the backup memory cells or backup memory cell areas to be used in another way. By way of example, it could be supplied with this information in the same way as the information about the location of the memory cells or memory cell areas to be replaced.

The information available to the selection device AE enables it to replace unusable memory cells or memory cell areas with backup memory cells or backup memory cell areas automatically.

In the example under consideration,
the backup memory cells or backup memory cell areas are each in the same memory cell row as the memory cells or memory
all memory cells (including the backup memory cells) in a memory cell row are read out during reading, and
the selection device AE defines the association between the data input and/or output connections D1 to Dm used for data input and/or data output and the memory cells which are to be written to or read from.

Therefore, and because the information about the location of the memory cells and memory c ell areas to be replaced is already supplied to the selection device before replacement of the memory cells or memory cell areas is initiated by the output signal from the logic unit L, the need to replace memory cells or memory cell areas which cannot be written to or read from properly with backup memory cells or backup memory cell areas can be established and the replacement implemented without any, or at any rate without any significant, delay in writing to or reading from the memory device.

The information about the location of the memory cells or memory cell areas which are to be replaced is supplied, in the example under consideration, on the basis of the output signals from the comparators K4, that is to say actually at an instant at which it is not yet definite that the address applied to the memory device has an associated memory cell which cannot be written to or read from properly or is in a memory cell area containing memory cells which cannot be written to or read from properly. The information about the location of the memory cells or memory cell areas to be replaced is transmitted at the earliest possible instant: in the example under consideration, this is as soon as it is no longer possible to rule out the address applied to the memory device having an associated memory cell which cannot be written to or read from properly or is in a memory cell area containing memory cells which cannot be written to or read from properly.

This means that the selection device AE is able to carry out any necessary replacement immediately after the replacement has been prompted by the output signal from the logic unit L; the selection device AE does not need to wait until it has the information about the location of the memory cells or memory cell areas to be replaced or until said information, which is required to carry out the replacement, is valid for it.

Of the comparators K4 in the comparison units in a comparison unit bank, only one may signal a match, owing to the definition of Ref4. This means that conflicts cannot arise in the multiplexer MUX. Each comparison unit bank is provided with a dedicated multiplexer MUX. Each multiplexer MUX supplies the selection device AE (which is common to all comparison unit banks) with information about the location of memory cells or memory cell areas which are to be replaced; the selection device AE has a corresponding number of connections.

The supply of information about the location of memory cells or memory cell areas to be replaced to the selection device AE does not yet prompt the selection device to make the appropriate replacements. This does not happen until the selection device AE is prompted to do this by an output signal from a logic unit L.

Each comparison unit bank is provided with a logic unit L. Each logic unit L supplies the selection device AE (common to all comparison unit banks) with its output signal; the selection device has a corresponding number of connections.

The output signals from the logic units L determine whether memory cells or memory cell areas are to be replaced, and which MUX output signals need to be taken into account to do this; the selection device uses the respective output signal from the multiplexer MUX which is associated with the comparison unit bank from which the signal prompting the selection device AE to replace memory cells or memory cell areas originates.

In a memory device designed as described, access operations on memory cells or memory cell areas which cannot be written to or read from properly can be detected and these memory cells or memory cell areas can be replaced with backup memory cells or backup memory cell areas as quickly as possible and with a minimum level of complexity.

We claim:

1. A memory device, comprising:
   a multiplicity of memory cells for storing data;
   at least one comparison unit having an address input and being configured to check whether an address received at said address input has a memory cell associated therewith which cannot be written to or read from properly or is in a memory cell area containing memory cells which cannot be written to or read from properly; and
   a selection device connected to said comparison unit, said selection device being configured to ensure that backup memory cells or backup memory cell areas are used instead of memory cells or memory cell areas which cannot be written to or read from properly;
   wherein information about a location of the memory cells or memory cell areas which are not to be used is supplied to said selection device at an instant at which a determination has not yet been made that the address received at said address input has a memory cell associated therewith which cannot be written to or read from properly or is in a memory cell area containing memory cells which cannot be written to or read from properly.

2. The memory device according to claim 1, wherein said selection device only ensures that backup memory cells or backup memory cell areas are used instead of memory cells or memory cell areas which cannot be written to or read from properly if it has previously been prompted to do so, and the prompt signal is issued only when it has been determined that the address applied to the memory device has an associated memory cell which cannot be written to or read from properly or is in a memory cell area containing memory cells which can not be written to or read from properly.

3. The memory device according to claim 1, wherein said at least one comparison unit is configured to carry out a plurality of comparison operations, and wherein a circumstance of whether an address applied to the memory device has an associated memory cell which cannot be written to or read from properly or is in a memory cell area containing memory cells which cannot be written to or read from properly is determined only when all comparison results are present.

4. The memory device according to claim 3, wherein said selection device receives information about the location of the memory cells or memory cell areas which are not to be used as soon as one or more comparison results mean that it is no longer possible to rule out that the address applied to said memory device has an associated memory cell which cannot be written to or read from properly or is in a memory cell area containing memory cells which cannot be written to or read from properly.

5. The memory device according to claim 4, wherein said selection device only ensures that backup memory cells or backup memory cell areas are used instead of memory cells or memory cell areas which cannot be written to or read from properly if it has previously been prompted to do so, and the prompt signal is issued only when it has been determined that the address applied to the memory device has an associated memory cell which cannot be written to or read from properly or is in a memory cell area containing memory cells which can not be written to or read from properly.

6. The memory device according to claim 4, wherein said at least one comparison unit is configured to carry out a plurality of comparison operations, and wherein a circumstance of whether an address applied to the memory device has an associated memory cell which cannot be written to or read from properly or is in a memory cell area containing memory cells which cannot be written to or read from properly is determined only when all comparison results are present.

7. The memory device according to claim 6, wherein said selection device receives information about the location of the memory cells or memory cell areas which are not to be used as soon as one or more comparison results mean that it is no longer possible to rule out that the address applied to said memory device has an associated memory cell which cannot be written to or read from properly or is in a memory cell area containing memory cells which cannot be written to or read from properly.

8. A memory device, comprising:
   a multiplicity of memory cells for storing data;
   at least one comparison unit having an address input and being configured to check whether an address received at said address input has a memory cell associated therewith which cannot be written to or read from properly or is in a memory cell area containing memory cells which cannot be written to or read from properly; and
   a selection device connected to said comparison unit, said selection device being configured to ensure that backup memory cells or backup memory cell areas are used instead of memory cells or memory cell areas which cannot be written to or read from properly;
   wherein information about a location of the memory cells or memory cell areas which are not to be used is actually supplied to said selection device before an instant at which said selection device is prompted to ensure that backup memory cells or backup memory cell areas are used instead of memory cells or memory cell areas which cannot be written to or read from properly.

* * * * *